United States Patent
Tsai et al.

[11] Patent Number: 6,015,757
[45] Date of Patent: Jan. 18, 2000

[54] METHOD OF OXIDE ETCHING WITH HIGH SELECTIVITY TO SILICON NITRIDE BY USING POLYSILICON LAYER

[75] Inventors: Chia-Shiung Tsai; Kuei-Ying Lee; Hun-Jan Tao, all of Hsinchu, Taiwan

[73] Assignee: Taiwan Semiconductor Manufacturing Co. Ltd., Taiwan

[21] Appl. No.: 08/887,034

[22] Filed: Jul. 2, 1997

[51] Int. Cl.[7] .................................................. H01L 21/302
[52] U.S. Cl. .......................... 438/697; 438/425; 438/431; 438/435; 438/750
[58] Field of Search ................................... 438/435, 694, 438/697, 691, 692, 750, 424, 425, 431

[56] References Cited

U.S. PATENT DOCUMENTS

| | | | |
|---|---|---|---|
| 5,077,234 | 12/1991 | Scoopo et al. | 437/67 |
| 5,108,946 | 4/1992 | Zdebel et al. | 437/72 |
| 5,696,020 | 12/1997 | Ryum et al. | 437/72 |
| 5,712,185 | 1/1998 | Tsai et al. | 437/67 |
| 5,726,090 | 3/1998 | Jang et al. | 438/435 |
| 5,786,262 | 7/1998 | Jang et al. | 438/424 |
| 5,801,082 | 9/1998 | Tseng | 438/424 |
| 5,911,110 | 6/1999 | Yu | 438/424 |

FOREIGN PATENT DOCUMENTS 8-031927  2/1996  Japan .

*Primary Examiner*—Robert Kunemund
*Assistant Examiner*—George Goudreau
*Attorney, Agent, or Firm*—Christensen, O'Connor, Johnson & Kindness PLLC

[57] ABSTRACT

A new method for planarization of shallow trench isolation is disclosed by using a polysilicon layer to prevent trench formed in a silicon nitride layer. The formation of the shallow trench isolation described herein includes a pad layer and a silicon nitride layer formed on a semiconductor wafer. A polysilicon layer is subsequently formed on the silicon nitride layer. A shallow trench is then created by photolithography and dry etching processes. The photoresist is subsequently removed in which an oxide layer is form in the shallow trench and on polysilicon layer for the purpose of isolation. A selective etching is used to etch the oxide layer. A CMP is performed to produce a planarized surface on a silicon wafer.

20 Claims, 4 Drawing Sheets

METHOD OF OXIDE ETCHING WITH HIGH SELECTIVITY TO SILICON NITRIDE BY USING POLYSILICON LAYER

FIELD OF THE INVENTION

The present invention relates to a method of isolation for integrated circuit (IC), and more specifically, to a method of forming the shallow trench isolation by using high selectively etching.

BACKGROUND OF THE INVENTION

The advent of Ultra Large Scale Integrated (ULSI) circuits have allowed semiconductor manufacturers worldwide to fabricate semiconductor devices to an extremely compact dimensions. The formation of semiconductor devices involves the process of fabrication which provides isolation within the semiconductor device. In order to fabricate integrated circuits (ICs), devices isolated from one another must first be formed in the silicon substrate. In fabrication of a ULSI, a small amount of leakage in a device can induce significant power dissipation for the overall circuit.

Trench isolation is used primarily for isolating devices in VLSI and ULSI, and hence they can be considered as replacement for conventional LOCOS isolation. Shallow trench isolation has gained popularity for in compact semiconductor dimensions such as quarter-micron technology. In a basic shallow trench isolation (STI) technology, shallow trenches are anisotropically etched into the silicon substrate. A CVD oxide is deposited onto the substrate and is then planarized by CMP (Chemical Mechanical Polishing) or etching back. Another approach to shallow trench isolation is called a Buried Oxide with Etch-Stop process (BOXES). The process uses a silicon-nitride etch-stop layer and a pad layer formed on the substrate before the CVD-oxide is deposited.

As shown in FIG. 1, on a silicon substrate 1, problems associated with the formation of STI include dishing effect 3 of wide trench, erosion of small nitride area, and oxide 4 remaining on large nitride area 6. The dishing effect degrades the planarity of a layer, and impacts the control of implantation during the implantation process. Isolated devices are fabricated in the area denoted by 2, silicon nitride may erode the area completely. This will damage the silicon substrate 1 and devices that are fabricated here. The oxide 4 that remains on the silicon nitride layer makes wet strip of silicon nitride unlikely.

Turning to FIG. 2, a pad oxide layer 5 and a silicon nitride layer 7 are respectively formed on a silicon substrate 1. In order to overcome the aformentioned problems during the formation of shallow trench isolation, a plurality of protrudent portions of the silicon oxide 9 are generated over the trench region. This structure is referred to as "reverse tone". The protruded portions can eliminate the dishing problem due to the removing rate of the CMP performed over the trench is faster than the neighboring regions.

However, conventional methods cause micron trench in a silicon nitride layer during a step of etching for forming the "reverse tone". Turning to FIG. 3, a photoresist 12 is patterned on the oxide layer 9 used to form the "reverse tone". A micron trench 10 is generated in the silicon nitride layer 7. The silicon nitride layer 7 may be removed during a subsequent step of STI CMP.

SUMMARY OF THE INVENTION

A method is disclose to fabricate a shallow trench isolation (STI) by using a hard mask to prevent trench formed in a silicon nitride layer during selective etching. A thin silicon dioxide layer is formed on a wafer to act as a pad layer. Subsequently, a silicon nitride layer is deposited on the pad layer to serve as a stop layer for subsequent chemical mechanical polishing (CMP). A polysilicon layer is then formed on the silicon nitride layer. A shallow trench is subsequently generated by using a dry etching technique. An oxide layer is refilled into the trench and formed on the polysilicon layer for isolation. A selective wet etching is performed to etch the oxide layer using diluted HF. A residual protruded portion of oxide remains over the trench. Subsequently, a chemical mechanical polishing (CMP) technology is used to remove the oxide layer to the surface of the silicon nitride layer for planarization.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclose to fabricate a shallow trench isolation (STI) by using selective etching. The present invention solves a dishing problem as well as eliminates the micron trench formed in a silicon nitride layer. As described below, this technique can be used for manufacturing the shallow trench isolation.

Figure 1:
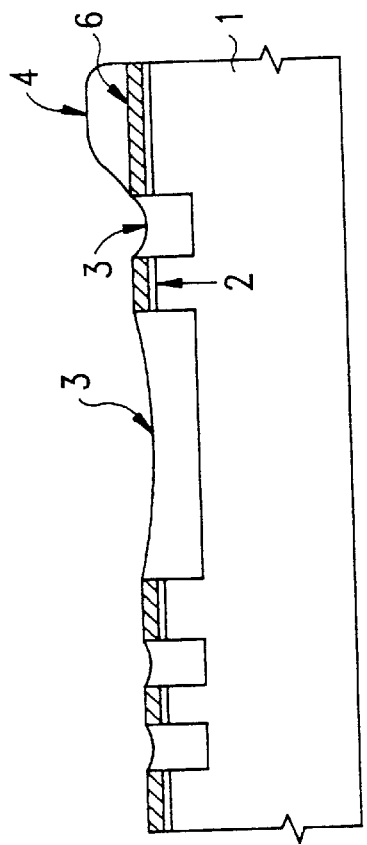
FIG. 1 is a cross section view of a semiconductor wafer illustrating the dishing problem on a substrate in accordance with prior art.
Figure 2:
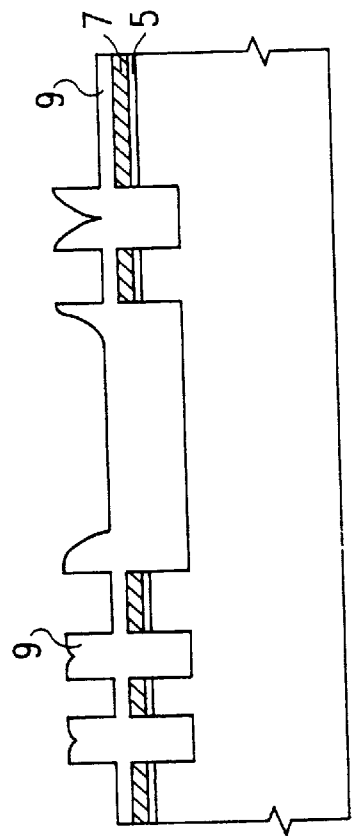
FIG. 2 is a cross section view of a semiconductor wafer illustrating the "reverse tone" structure in accordance with prior art.
Figure 3:
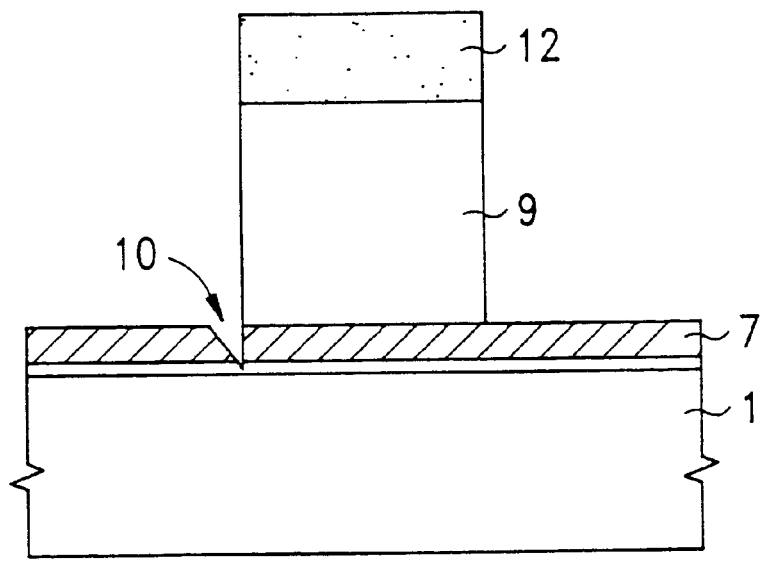
FIG. 3 is a cross section view of a semiconductor wafer illustrating a micron trench formed in a silicon nitride layer in accordance with prior art.
Figure 4:
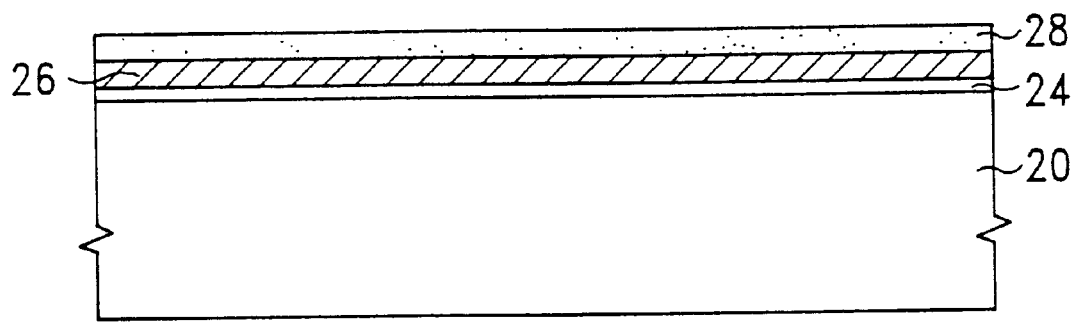
FIG. 4 is a cross section view of a semiconductor wafer illustrating the step of forming a pad oxide, a silicon nitride layer and a polysilicon layer on a substrate in accordance with the present invention.

Referring to FIG. 4, in the preferred embodiment, a semiconductor wafer, such as a silicon wafer 20 with <100> crystallographic orientation is provide. A thin silicon dioxide layer 24 is formed on the wafer 20 to act as a pad layer. The pad layer 24 is used to be a cushion between the silicon wafer 20 and successive silicon nitride layer for reducing the tress between these two layers. For example, the silicon dioxide layer 24 can be formed by thermal oxidation process, i.e. silicon dioxide layer 24 is formed in an oxygen-steam ambient at a temperature of about 800–1100° C. Alternatively, the oxide layer 24 may be formed using any suitable chemical vapor deposition. In the instant case, the thickness of the silicon dioxide layer is approximately 50–500 angstroms.

A silicon nitride layer 26 is deposited on the silicon dioxide layer 24 to serve as a stop layer for subsequent chemical mechanical polishing (CMP). The silicon nitride layer 26 can be deposited by any suitable process. As known by a person of ordinary skills in the art, the silicon nitride layer 26 can be formed using Low Pressure Chemical Vapor Deposition (LPCVD), Plasma Enhance Chemical Vapor Deposition (PECVD), and High Density Plasma Chemical Vapor Deposition (HDPCVD). The thickness of the silicon nitride layer 26 is about 500 to 2000 angstroms. Further, the temperature forming the silicon nitride layer 26 is at a range of 400–800° C. Preferably, the temperature for the CVD is about 400–500° C. while the temperature is about 500–800° C. for LPCVD. In the preferred embodiment, the reaction gases of the step to form silicon nitride layer 26 are $SiH_4$, $NH_3$, $N_2$, $N_2O$ or $SiH_2Cl_2$, $NH_3$, $N_2$, $N_2O$.

Successively, a hard mask layer 28 is formed on the silicon nitride layer 26. The hard mask layer 28 must have a low selectively etching rate to a subsequent trench filling layer. To phrase in another way, the trench filling layer will be etched significantly during subsequent etching process to form the so call "reverse tone". Preferably, a thin undoped polysilicon layer 28 is deposited on the silicon nitride layer 28 to a thickness of about 500 to 1000 angstroms. The polysilicon layer 28 is utilized to serve as a mask for preventing the silicon nitride layer 26 from forming micron trench during the formation of "reverse tone". The polysilicon layer 28 typically can be formed by using chemical vapor deposition.

Figure 5:
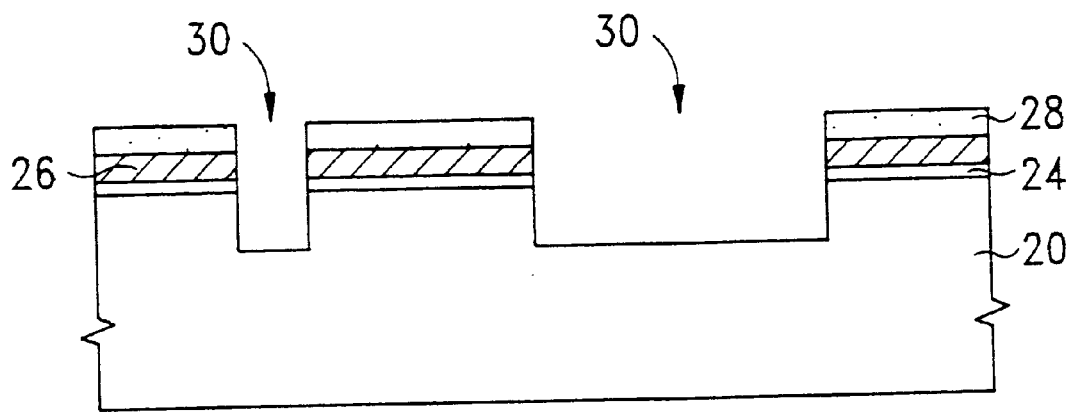
FIG. 5 is a cross section view of a semiconductor wafer illustrating the step of forming a shallow trench in the substrate in accordance with the present invention.

Turning to FIG. 5, a plurality of shallow trenches 30 are formed in the wafer using lithography technology and etching process. For example, a photoresist is patterned on the polysilicon layer 28 to define the trench regions. The shallow trenches 10 are subsequently generated by using a dry etching technique. It is well known in the art that by controlling the recipe, the polysilicon layer 28, silicon nitride layer 26, the silicon dioxide layer 24 and the silicon wafer 20 can be respectively etched away. The depth of the shallow trench is typically about 5000 to 10000 angstroms measured from the surface of the polysilicon layer 28. The photoresist is then stripped away after the trenches 30 are formed.

Figure 6:
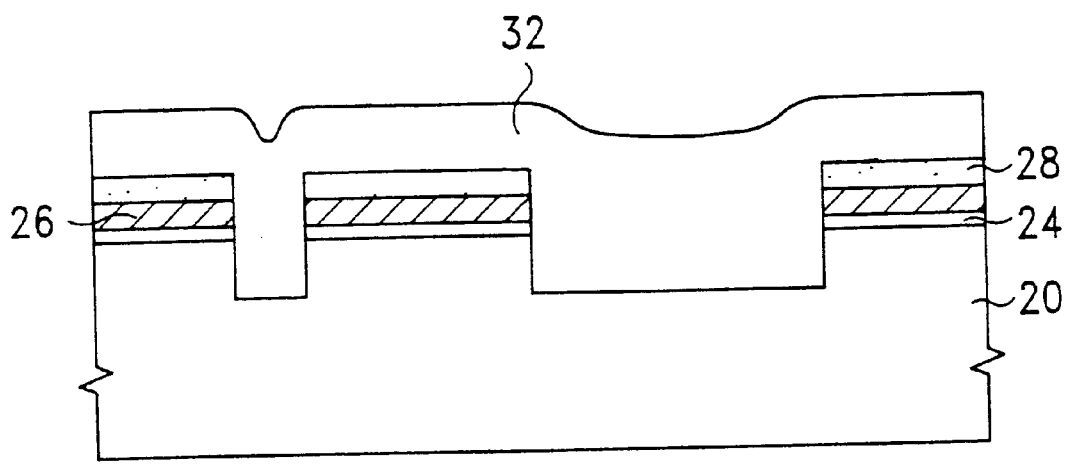
FIG. 6 is a cross section view of a semiconductor wafer illustrating the step of forming a oxide layer in the shallow trench and on the polysilicon layer in accordance with the present invention.

Turning next to FIG. 6, a trench filling layer 32 is then refilled in the trenches 30 and formed on the polysilicon layer 28 for isolation. Preferably, lining oxide, plasma enhance oxide or sub-atmospheric chemical vapor deposition oxide can be used to act as trench filling material. Alternatively, an ozone-TEOS layer can be used to refill into the trench 10 as the isolation. The thickness of the lining oxide is about 350 angstroms while the temperature of the reaction is about 920 degree C. If the PE-oxide serves the trench filling material, then the thickness can range from 450 to 500 angstroms, whereas the SACVD oxide is about 6500angstroms. Preferably, the ozone-TEOS layer is formed at a temperature in the range of about 400 to 480° C. Successively, a thermal process is carried out to densify the trench filling layer 32 at temperature about 950 to 1050 degree C. for 30 to 130 minutes.

Figure 7:
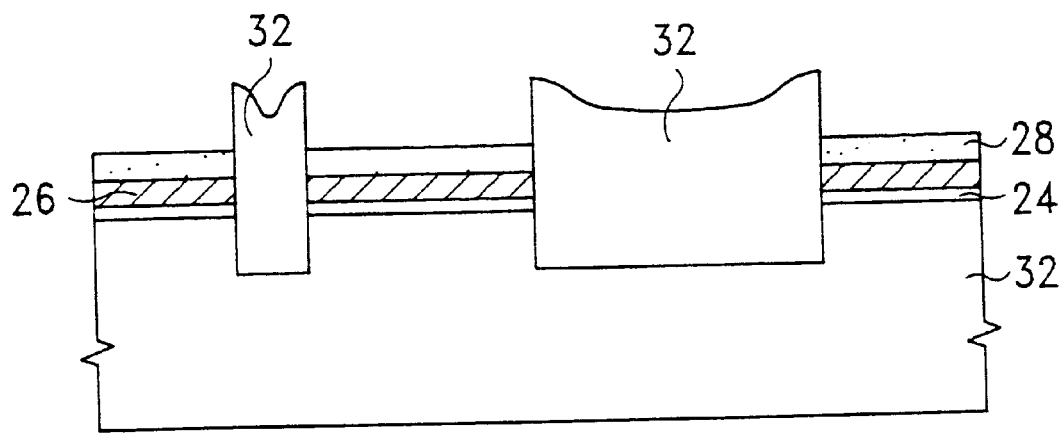
FIG. 7 is a cross section view of a semiconductor wafer illustrating the step of performing selective wet etching to etch the oxide layer in accordance with the present invention.

Referring next to FIG. 7, a selective wet etching is performed using a photoresist as a mask to etch the trench filling layer 32. In the preferred embodiment, the etchant of the etching is selected from diluted HF or BOE (buffer oxide etching). The silicon nitride layer 26 will be shielded from penetration because the polysilicon layer 28 serves as a mask to protect the silicon nitride layer 26. Conversely, in prior art, the etching rate of silicon nitride 26 is close to the etching rate of oxide 32. Thus, a plurality of micro trenches will be generated in the silicon nitride layer 26. This problem will be eliminated in the present invention. This step is used to generate the "reverse tone". Therefore, a plurality of protruded portions of trench filling layer 32 remains over the trench 20. The photoresist is then stripped away.

Figure 8:
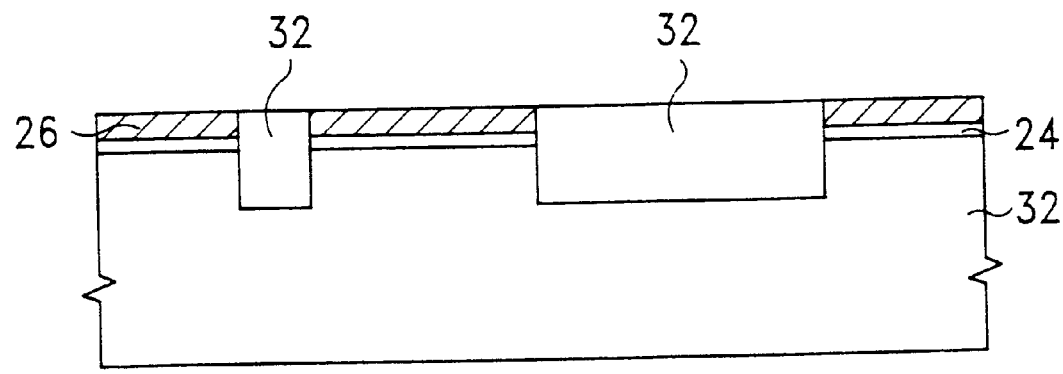
FIG. 8 is a cross section view of a semiconductor wafer illustrating the step of performing a chemical mechanical polishing to the oxide layer in accordance with the present invention.

Referring to FIG. 8, subsequently, a chemical mechanical polishing (CMP) technology is used to remove the trench filling layer 32 to the surface of the silicon nitride layer 26 for planarization. The silicon nitride layer 26 and the pad oxide layer 24 are respectively removed using conventional techniques. For example, the silicon nitride layer 26 is removed by hot phosphorous acid, whereas the pad oxide 24 is removed using HF solution.

As is understood by a person skilled in the art, the foregoing preferred embodiment of the present invention is illustrated of the present invention rather than limiting of the present invention. For example, the present invention uses the PE-oxide layer as the trench filling material. Another oxide, such as ozone-TEOS SACVD oxide layer can also be used for the isolation. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a shallow trench isolation on a wafer, said method comprising the following steps of:

forming a pad layer on said wafer;

forming a silicon nitride layer over said pad layer;

forming a hard mask layer over said silicon nitride layer;

forming a trench by etching said hard mask layer, said silicon nitride layer, said pad layer and said wafer;

forming a trench filling layer for isolation on said hard mask layer and filling into said trench, a first etching rate of said trench filling layer being faster than a second etching rate of said hard mask layer; and selectively etching said trench filling layer, resulting in a residual protruded trench filling layer remaining over said trench to act as a reverse tone structure, wherein said hard mask is used to prevent said silicon nitride layer from being etched during said selectively etching.

2. The method of claim 1 further comprising the step of:

after the step of said selectively etching, planarizing said trench filling layer by using chemical mechanical polishing to the surface of said silicon nitride layer.

3. The method of claim 1 further comprising the step of:

after the step of forming said trench filling layer, performing a thermal annealing densification.

4. The method of claim 2 further comprising the step of:

after the step of forming said trench filling layer, performing a thermal annealing for densification.

5. The method of claim 1, wherein the step of forming said shallow trench comprises of:

patterning a photoresist on said hard mask layer to define a shallow trench region; and etching said hard mask layer, said silicon nitride layer, said pad layer and said silicon substrate by using said photoresist as a mask; and removing said photoresist.

6. The method of claim 1, wherein said trench filling layer is selected from the group of consisting of lining oxide layer, PE-oxide (plasma enhance oxide) layer, SACVD-oxide (subatmospheric chemical vapor deposition oxide) layer and ozone-TEOS layer.

7. The method of claim 6, wherein said hard mask layer is a polysilicon layer.

8. The method of claim 7, wherein said polysilicon layer is formed to have a thickness of about 500 to 1000 angstroms.

9. The method of claim 6, wherein said ozone-TEOS layer is formed at a temperature in the range of about 400 to 480° C.

10. The method of claim 6, wherein the thickness of said lining oxide layer is about 350 angstroms.

11. The method of claim 6, wherein the thickness of said PE-oxide layer is about 450–500 angstroms.

12. The method of claim 6, wherein the thickness of said SACVD oxide layer is about 6500 angstroms.

13. The method of claim 1, wherein said selective etching comprises diluted HF.

14. The method of claim 1, wherein said silicon nitride layer is formed by a method selected from the group consisting of Low Pressure Chemical Vapor Deposition (LPCVD), Plasma Enhance Chemical Vapor Deposition (PECVD) and High Density Plasma Chemical Vapor Deposition (HDPCVD).

15. The method of claim 14, wherein the reaction gases of forming said silicon nitride layer comprises $SiH_4$, $NH_3$, $N_2$, $N_2O$.

16. The method of claim 14, wherein the reaction gases of forming said silicon nitride layer comprises $SiH_2Cl_2$, $NH_3$, $N_2$, $N_2O$.

17. The method of claim 14, wherein the temperature of forming said silicon nitride layer is about 400–800° C.

18. The method of claim 1, wherein the thickness of said silicon nitride layer is about 500 to 2000 angstroms.

19. The method of claim 3, wherein said thermal annealing is carried out at a temperature of about 950 to 1050° C., 30 to 130 minutes.

20. The method of claim 4, wherein said thermal annealing is carried out at a temperature of about 950 to 1050° C., 30 to 130 minutes.

* * * * *

UNITED STATES PATENT AND TRADEMARK OFFICE
CERTIFICATE OF CORRECTION

PATENT NO. : 6,015,757
DATED : January 18, 2000
INVENTOR(S) : C.-S. Tsai et al.

It is certified that error appears in the above-indentified patent and that said Letters Patent is hereby corrected as shown below:

| COLUMN | LINE | ERROR |
|---|---|---|
| 6 (Claim 20, | 12 line 3) | "130minutes" should read --130 minutes-- |
| [57] Pg. 1, col. 2 | Abstract 3 of text | "formed" should read --from forming-- |
| [57] Pg. 1, col. 2 | Abstract 9 of text | "form" should read --formed-- |

Signed and Sealed this

First Day of May, 2001

Attest:

NICHOLAS P. GODICI

Attesting Officer       Acting Director of the United States Patent and Trademark Office